United States Patent [19]
Aschner et al.

[11] Patent Number: 6,005,226
[45] Date of Patent: Dec. 21, 1999

[54] RAPID THERMAL PROCESSING (RTP) SYSTEM WITH GAS DRIVEN ROTATING SUBSTRATE

[75] Inventors: Helmut Aschner, Beimerstetten; Andreas Hauke, Neu-Ulm; Ulrich Walk; Dieter Zernickel, both of Ulm, all of Germany

[73] Assignee: Steag-RTP Systems, Germany

[21] Appl. No.: 08/977,019

[22] Filed: Nov. 24, 1997

[51] Int. Cl.$^6$ .................................................. H05B 1/00
[52] U.S. Cl. .......................... 219/390; 118/728; 118/730; 392/419
[58] Field of Search ................... 219/390, 405, 219/411; 392/419, 416, 418; 118/728, 730, 50.1; 432/253, 258

[56] References Cited

U.S. PATENT DOCUMENTS

| | | |
|---|---|---|
| 4,593,168 | 6/1986 | Amada . |
| 4,667,076 | 5/1987 | Amada . |
| 4,860,687 | 8/1989 | Frijlink . |
| 5,226,383 | 7/1993 | Bhat . |
| 5,444,217 | 8/1995 | Moore et al. . |
| 5,643,366 | 7/1997 | Somekh et al. . |

FOREIGN PATENT DOCUMENTS

| | | |
|---|---|---|
| 3137301A1 | 4/1983 | Germany . |
| 3306999C2 | 10/1983 | Germany . |
| 3402630A1 | 8/1984 | Germany . |
| 3504021A1 | 10/1985 | Germany . |
| 3608783A1 | 9/1987 | Germany . |
| 3608783C2 | 9/1987 | Germany . |
| 04025122 | 5/1990 | Japan . |
| 04100223 | 4/1992 | Japan . |
| 2277748A | 11/1994 | United Kingdom . |

OTHER PUBLICATIONS

P.M. Frijlink, A new versatile, large size MOVPE reactor, J. Crystal Growth 93, 207 (1988).

*Primary Examiner*—Philip H. Leung
*Assistant Examiner*—Shawntina T. Fuqua
*Attorney, Agent, or Firm*—Rodney T. Hodgson

[57] ABSTRACT

An apparatus, method, and system for Rapid Thermal Processing (RTP), whereby the object to be processed is rotated under the radiation sources of the RTP system by a gas jet system, is presented.

26 Claims, 6 Drawing Sheets

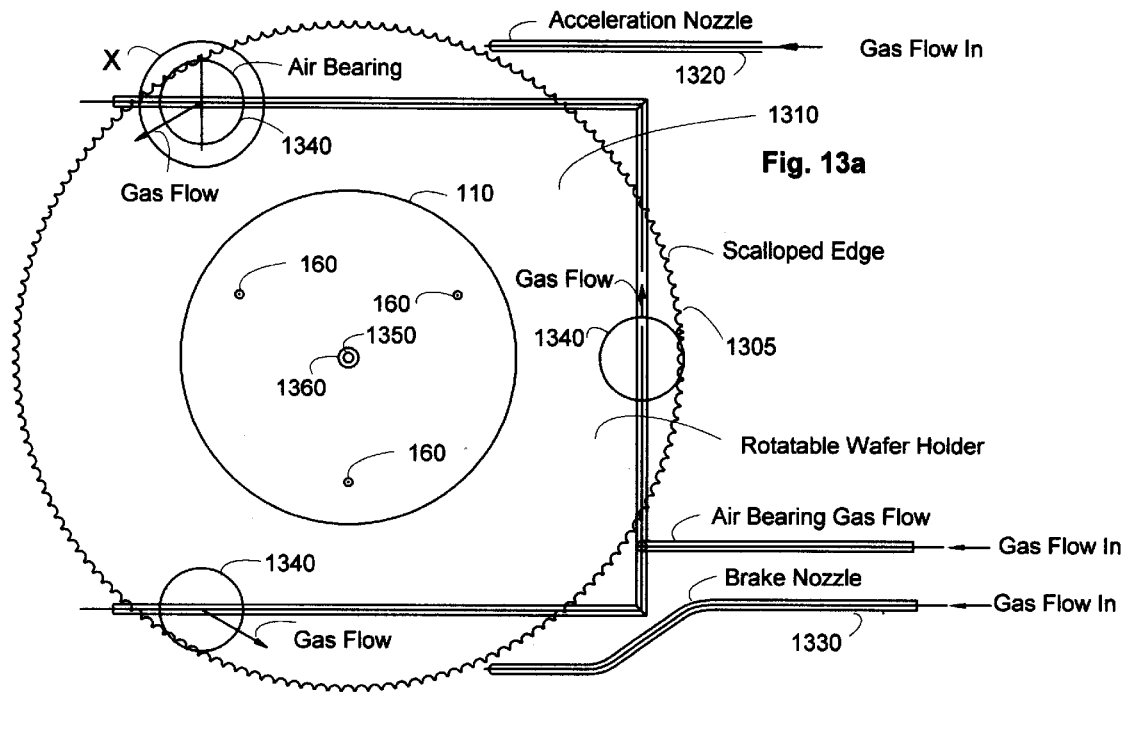
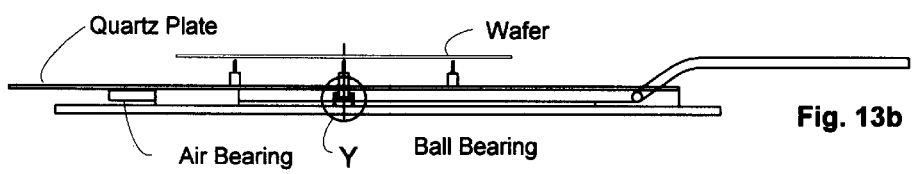
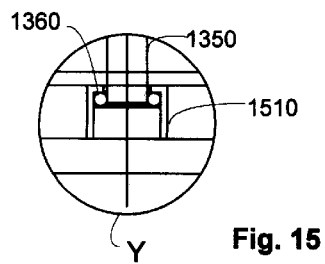
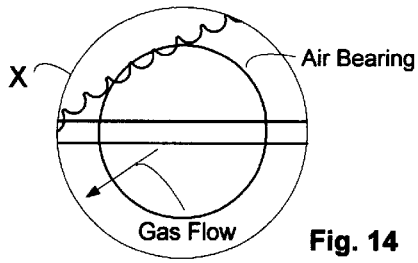

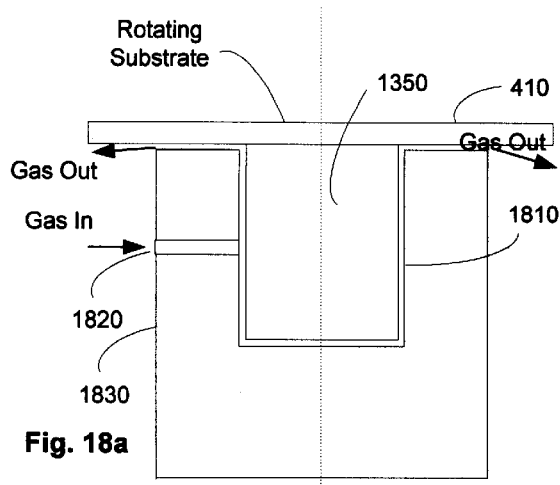
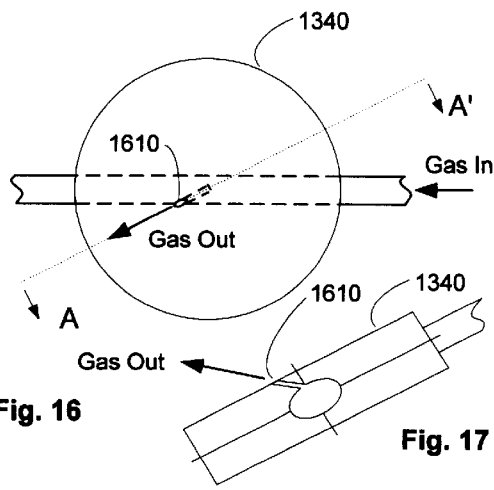
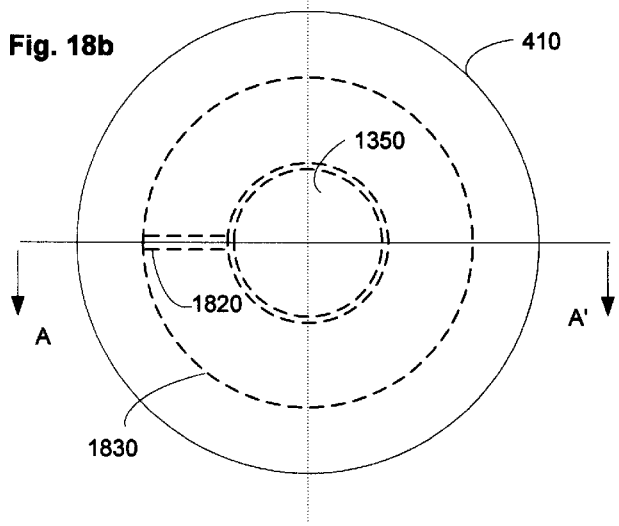
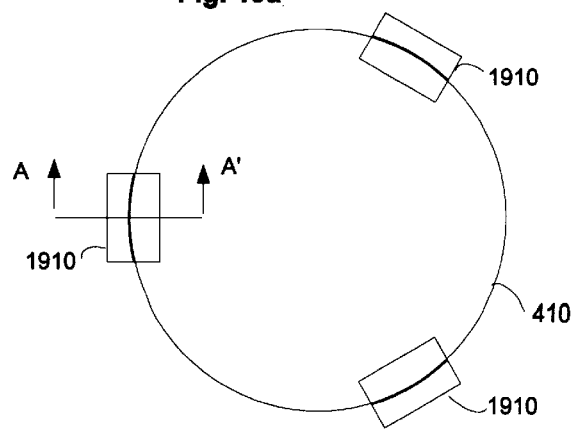
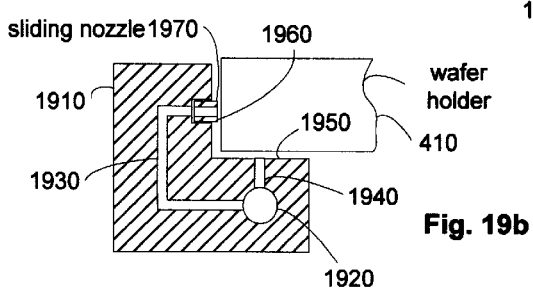

RAPID THERMAL PROCESSING (RTP) SYSTEM WITH GAS DRIVEN ROTATING SUBSTRATE

FIELD OF THE INVENTION.

The present invention relates to a system, apparatus, and method for more uniformly heating objects in a Rapid Thermal Processing (RTP) system. More specifically, the present invention discloses a convenient, inexpensive way to rotate semiconductor wafers treated in such system.

BACKGROUND OF THE INVENTION

The major problem faced by the field of RTP has been the uniformity of heating of the semiconductor wafers treated in the RTP systems. RTP systems generally have a chamber with at least one wall transparent to radiation from sources of radiation such as lamps. The object to be processed is placed in the chamber and irradiated with radiation from the radiation source so that the object is heated. The chamber with the transparent wall is not strictly necessary in the system, provided that the system controls the atmosphere in which the object is placed during processing. The lamps could then be placed in proximity to the object without the intervening window. Much progress has been made in using batteries of lamps with individual control of each lamp to increase uniformity of the illuminating radiation. However, the uniformity of the resulting material is not sufficient for present and future demands from the industry.

One way to increase the uniformity of result in such systems is to rotate the substrate under the lamps. Many prior art systems have been published to effect this rotation. However, these many systems generally used only one bank of lamps on one side of the semiconductor wafer. The other side of the wafer could then be used for various shafts which penetrated through the chamber walls to mechanically rotate the wafer with respect to the lamps. The prior art is deficient in that the systems are expensive and difficult to seal. The prior art systems also allow contaminants scrubbed from the relatively moving parts to contaminate the chamber. The prior art systems can not be used with banks of lights on either side of the wafer since the shaft, the rotating base holding the wafer, and the fittings necessary to allow the shaft to rotate with respect to the chamber block or otherwise interfere with light from the bank on the same side of the wafer as the shaft, and the resulting light impinging on the wafer is no longer uniform.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830, assigned to the assignee of the present invention, hereby incorporated by reference, teaches the importance of the gas flow and the use of an aperture in the door to regulate gas flow and control impurities in the process chamber.

The importance of measuring the temperature of the wafer using a pyrometer of very broad spectral response is taught in U.S. Pat. No. 5,628,564, which is assigned to the assignee of the present invention and is hereby incorporated by reference.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, assigned to the assignee of the present invention, hereby incorporated by reference, teaches the importance succeptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, assigned to the assignee of the present invention, hereby incorporated by reference, supplies a method and apparatus for overcoming this problem.

A method of raising the emissivity of a lightly doped, relatively low temperature wafer by locally heating the wafer with a pulse of light is disclosed in copending application Ser. No. 08/632,364, which is assigned to the assignee of the present invention and hereby incorporated by reference.

A method, apparatus, and system for RTP of a rotating object is disclosed in copending application Ser. No. 08/953, 590, filed Oct. 17, 1997, by Lerch et al., which is assigned to the assignee of the present invention and hereby incorporated by reference.

SUMMARY OF THE INVENTION

According to this invention, the object to be processed in an RTP system is rotated by impinging a gas flow on either the object or on a rotatable wafer holder holding the object. The same or another gas flow may be used as an air bearing to support the object or the wafer holder while the object or wafer holder is being rotated by the gas flow. Auxiliary gas jets may be used to accelerate and/or to decelerate the rotation of the object or the wafer holder carrying the object. The gas flow may be inert, or it may contain chemicals which react with the object to be processed, or it may be a gas which reacts or decomposes to create a layer on an exposed surface of the object to be processed.

BRIEF DESCRIPTION OF THE DRAWINGS

FIG. 13a shows a sketch of a plan view of a prototype setup an apparatus of the invention.

FIG. 13b shows a sketch of an elevation view of a prototype setup an apparatus of the invention.

FIG. 14 shows an expanded view of the air bearing X of FIGS. 13a–b.

FIG. 15 shows an elevation view Y of the shaft and bearing arrangement of FIGS. 13a–b.

FIG. 16 is an expanded plan view of an air bearing of FIG. 14.

FIG. 17 is an elevation view of a cross section of FIG. 16 taken along the line A–A' of FIG. 16.

FIG. 18a shows an elevation view of an alternative bearing for centering the rotating wafer holder FIG. 18b shows a plan view of an alternative bearing for centering the rotating wafer holder.

FIG. 19a shows an alternative embodiment where air bearings both support the wafer holder and ensure that the rotating wafer holder rotates about its axis.

FIG. 19b shows an elevation view of the air bearing of FIG. 19a.

DETAILED DESCRIPTION OF THE INVENTION

Figure 1:
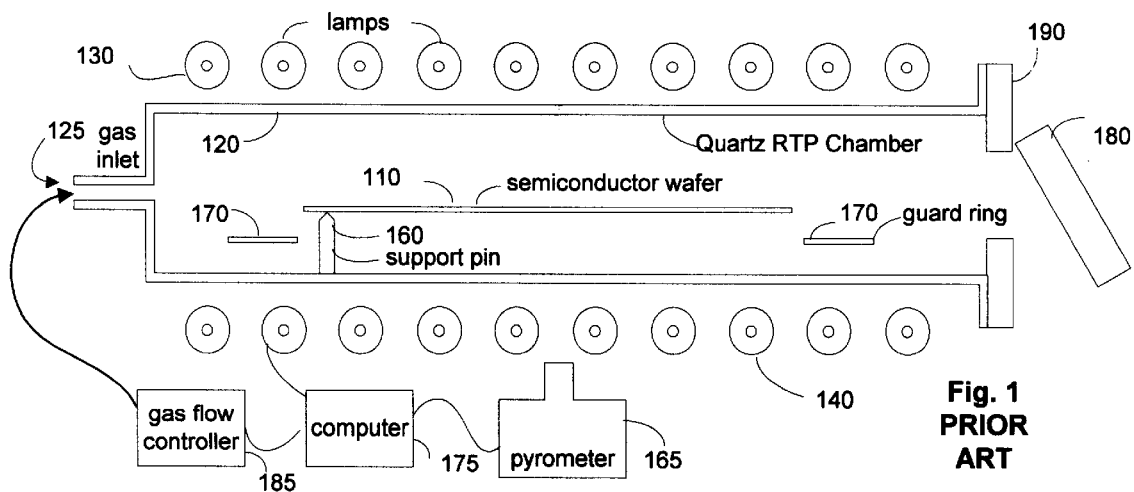
FIG. 1 shows a prior art RTP processing system.

FIG. 1 shows a prior art RTP processing system. A semiconductor wafer 110 or other object to be processed is supported in a quartz RTP chamber 120 by quartz support pins 160 (only one shown). A guard ring 170 is used to lessen edge effects of radiation from the edge of the wafer 110. An end plate 190 seals to the chamber 120, and a door 180 allows entry of the wafer 110 and, when closed, allows the chamber to be sealed and a process gas 125 to be introduced into the chamber. Two banks of radiation sources 130 and 140 are shown on either side of the wafer 110. A computer 175 or other control means as are known in the art is used to control the lamps 130 and 140, and to control the gas flow controller 185, the door 180, and the temperature measuring system, denoted here as a pyrometer 165. The gas flow may be an inert gas which does not react with the wafer, or it may be a reactive gas such as oxygen or nitrogen which reacts with the material of the semiconductor wafer to form a layer of on the semiconductor wafer, or the gas flow may be a gas which reacts at the heated surface of the object being processed to form a layer on the heated surface without consuming any material from the surface of the object. When the gas flow reacts to form a layer on the surface, the process is called rapid thermal-chemical vapor deposition (RT-CVD). An electrical current may be run through the atmosphere in the RTP system to produce ions which are reactive with or at the surface, and to impart extra energy to the surface by bombarding the surface with energetic ions.

Figure 2:
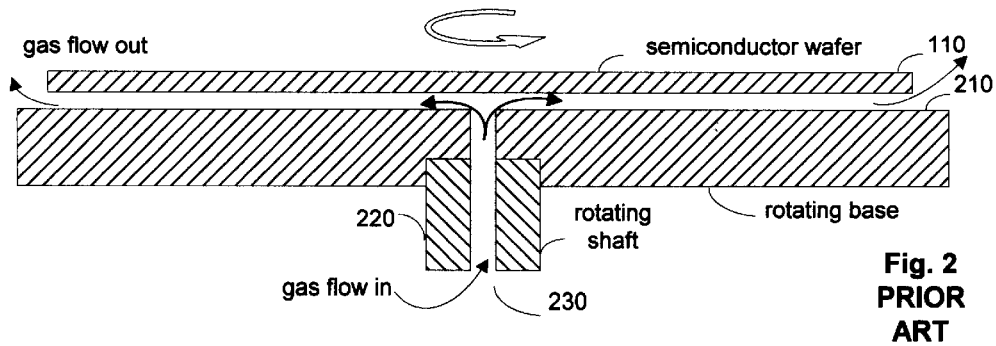
FIG. 2 shows a prior art rotating base holding a wafer 110.

FIG. 2 shows a prior art rotating base 210 holding a wafer 110. The rotating base 210 is rotated by a shaft 220. In U.S. Pat. No. 3,627,590, by W. Mammel, a gas is introduced into the space between the wafer 110 and the rotating base 210 to hold the wafer away from the base and reduce the heat transferred from the wafer 110 to the base 210. The gas flows radially outward from the shaft 220, and the gas does not rotate the wafer 110 with respect to the base 210.

Figure 3:
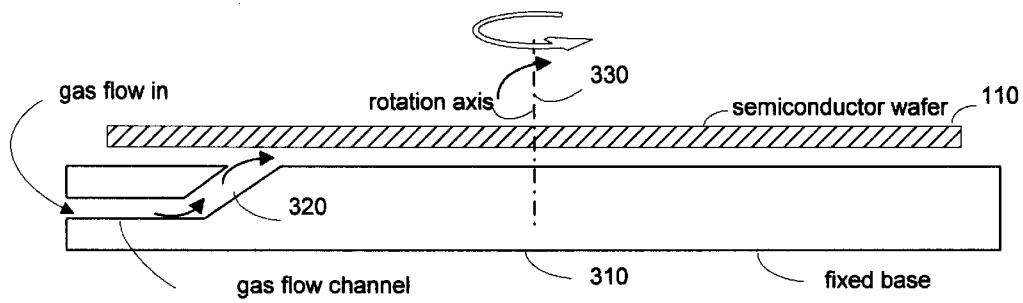
FIG. 3 shows a diagram of the apparatus of the invention.

FIG. 3 shows a diagram of the apparatus of the invention. A base 310 fixed with respect to the RTP system has gas flow channels 320 which carry a flowing gas 340 which impinges on the wafer 110 at an angle, the angle such that the force operates on the wafer 110 to rotate the wafer 110 with respect the base 310. The wafer then may rotate with respect to the base around an axis 330. The flowing gas 340 also supports the wafer 110 above the fixed base 310 in this case.

Figure 4:
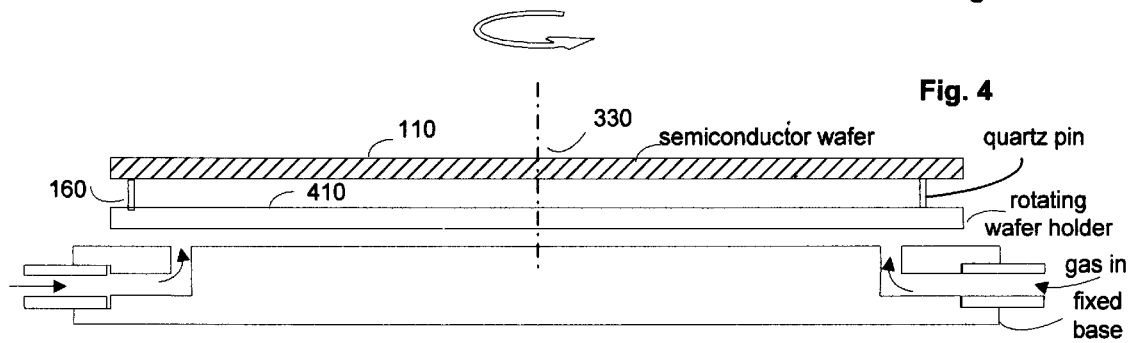
FIG. 4 shows a more preferred embodiment of the invention.

FIG. 4 shows a more preferred embodiment of the invention where the fixed base 310 supports a rotatable wafer holder 410, and the rotatable wafer holder 410 supports the wafer 110 with quartz pins 160. The gas flow 340 impinging on the rotatable wafer holder 410 causes the rotatable wafer holder 410 to rotate about axis 330. The flowing gas 340 also supports the rotatable wafer holder 410 above the fixed base 310, in this case.

Figure 5:
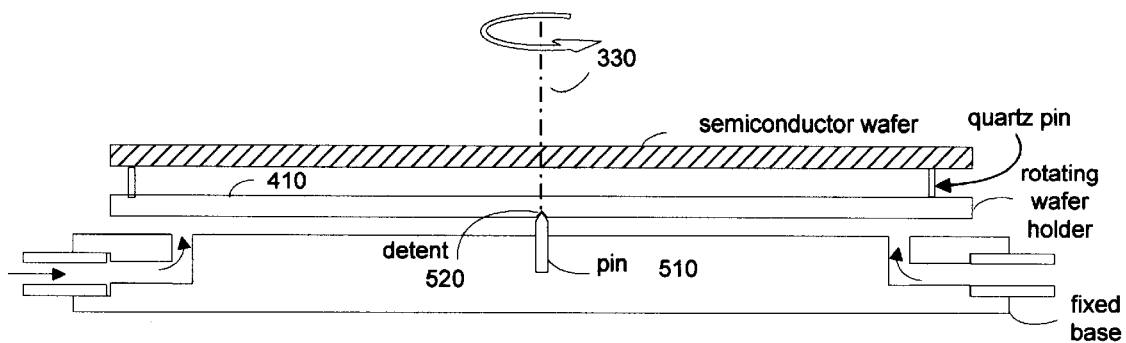
FIG. 5 shows a rotatable wafer holder.

FIG. 5 shows a rotatable wafer holder 410, where the wafer holder 410 is constrained to rotate about the axis 330 by a pin 510 fixed with respect to the base 310, the pin 510 fitting into a detent 520 in the rotatable wafer holder 410.

Figure 6:
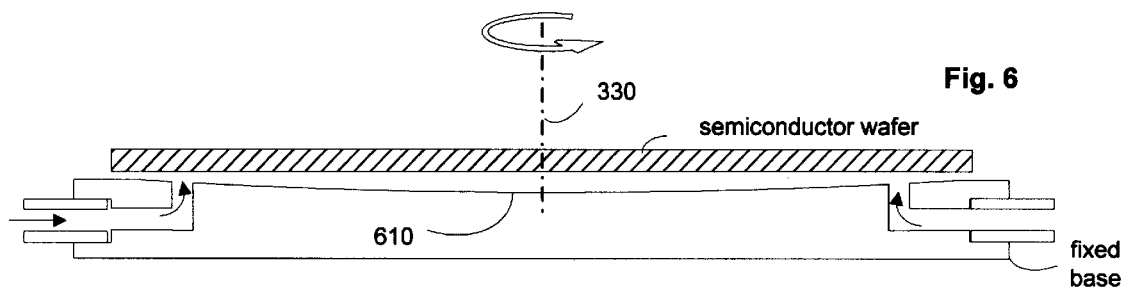
FIG. 6 shows a sketch of a fixed base which is shaped so that the pressure of the flowing gas both supports and centers the wafer.

FIG. 6 shows a sketch of a fixed base 310 which is shaped so that the pressure of the flowing gas both supports and centers the wafer 110 when the wafer 110 is rotating about the axis 330. FIG. 6 shows a saucer shaped depression 610 in the base 310.

Figure 7:
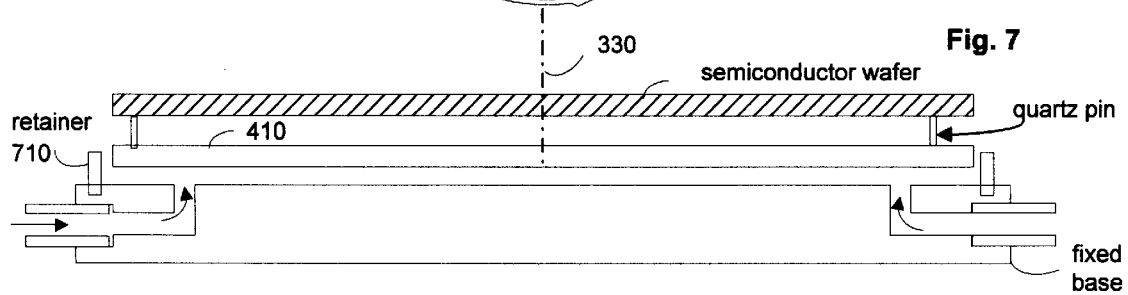
FIG. 7 shows a wafer holder holding a wafer where the wafer holder is constrained to rotate about an axis by retainer members.

FIG. 7 shows a wafer holder holding a wafer, the wafer holder constrained to rotate about an axis 330 by retainer members 710.

Figure 8:
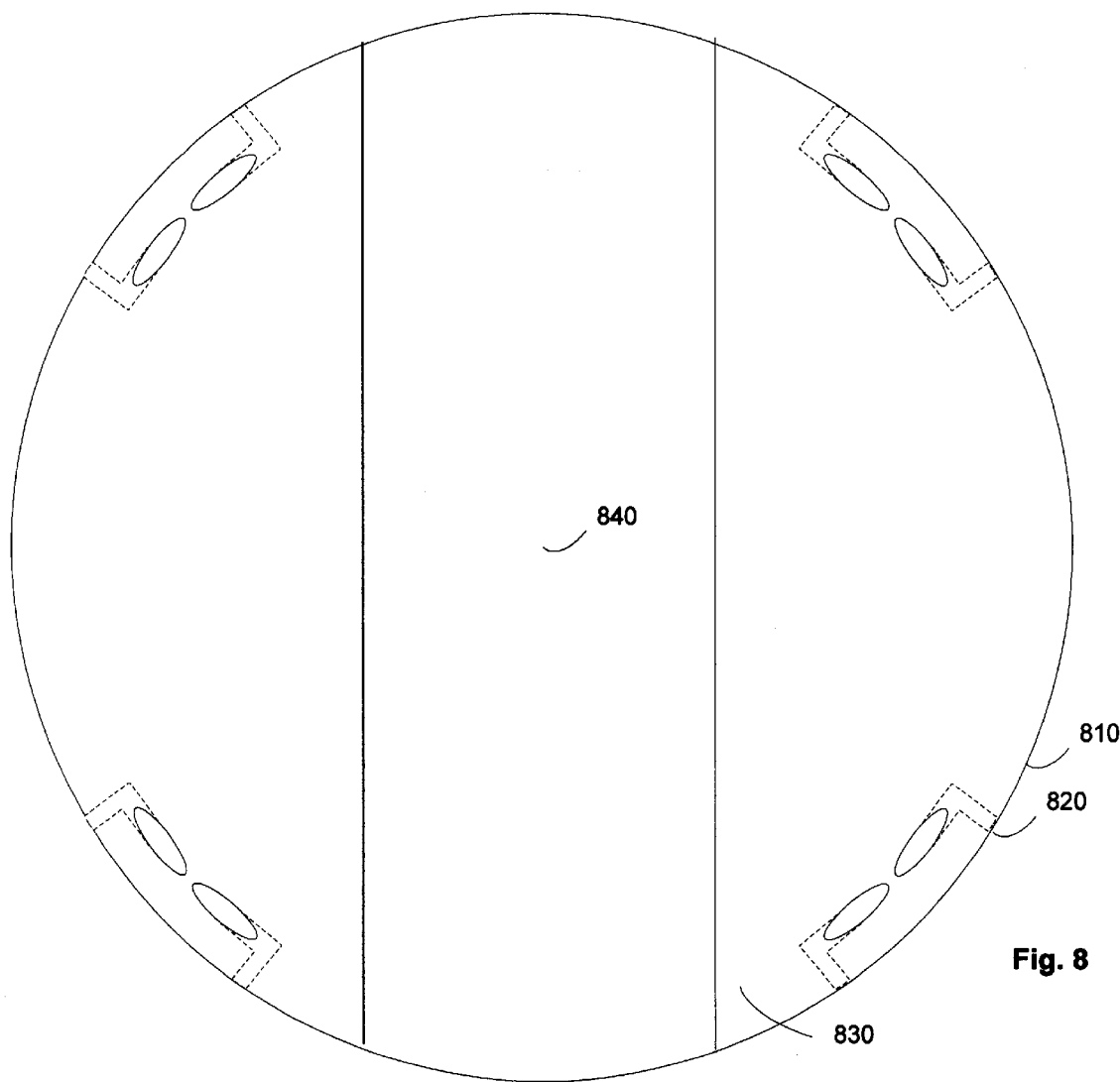
FIG. 8 shows a plan view of a base for supporting a rotatable wafer.

FIG. 8 shows a plan view of a base 810 for supporting a rotatable wafer. The base contains gas flow channels 820 which exit the base 810 at an angle with respect to the surface 830 of the base 810 and perpendicular to the radius drawn from the center 840 of the base 810 to the flow channel 820. The flowing gas then imparts angular momentum to the wafer 110 (not shown) when the wafer is supported by the flowing gas above the surface 830 of the base 810.

Figure 9:
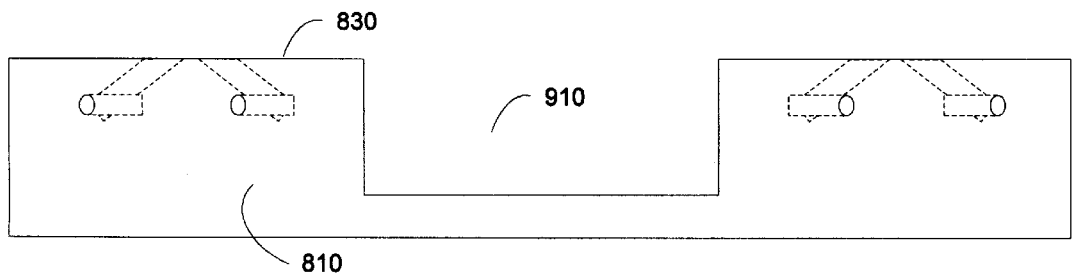
FIG. 9 shows an elevation of the base with a notch cut to allow a robot pan to bring in and deposit a wafer.

FIG. 9 shows an elevation of the base 810 with a notch 910 cut to allow a robot pan (shown later) to bring in and deposit a wafer (shown later) on to the surface 830 of the base 810.

Figure 10:
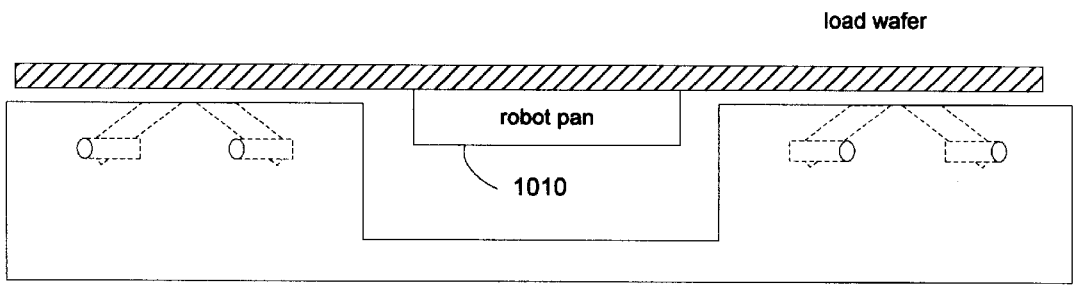
FIG. 10 shows a robot pan carrying a wafer entering the chamber and holding the wafer above a base.
Figure 11:
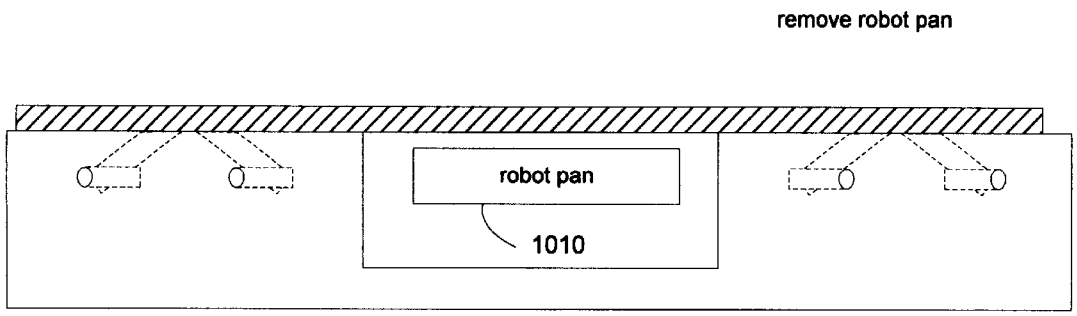
FIG. 11 shows that the robot pan has lowered the wafer on to the surface of the base.
Figure 12:
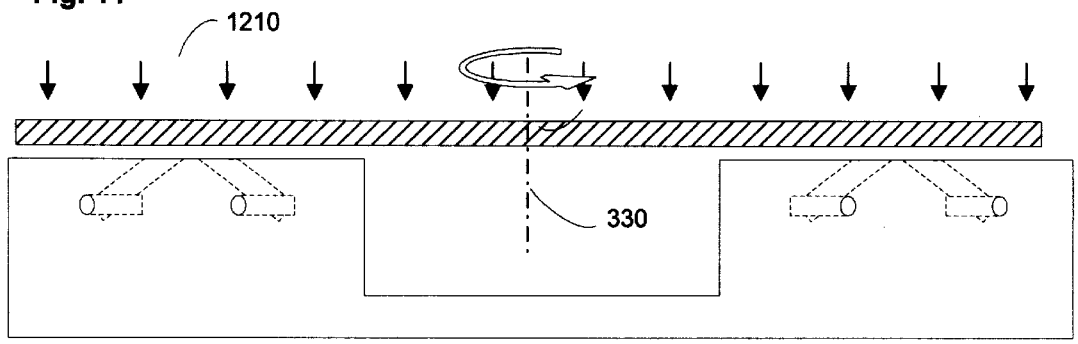
FIG. 12 shows that the robot pan has withdrawn, and that the flowing gas has levitated the wafer above the surface of the base, and that the wafer is rotating about the axis.

FIGS. 10–12 show a method of using the present invention. A robot pan 1010 carrying a wafer 110 enters the chamber and holds the wafer 110 above the base in FIG. 10. FIG. 11 shows that the robot pan has lowered the wafer 110 on to the surface 830 of the base 810. FIG. 12 shows that the robot pan has withdrawn, and that the flowing gas has levitated the wafer 110 above the surface 830 of the base, and that the wafer 110 is rotating about the axis 330. The rotation is driven by the tangential velocity of the flowing gas. Light 1210 and 1220 is shown impinging on the wafer from above and below. The base 310 is preferably made of quartz, so that the light passes through the quartz and illuminates the wafer uniformly. Other materials, such as sapphire, which are transparent to the radiation from the radiation sources of the RTP system could equally well be used for the material of the base.

FIGS. 13a–b show plan and elevation sketches of a prototype setup which has been used successfully to rotate a wafer in an AST SHS 3000 RTP system. Air bearings 1340 support the wafer holder 1310 and impart tangential momentum to the wafer holder 1310. The air bearings with the angled air flow shown are sufficient to maintain rotational speed of the wafer holder, but the acceleration to the desired edge velocity of 100 feet per minute is not sufficient. In addition, the friction is so low that the wafer holder takes one minute to slow down in a separate experiment when the tangential flow is turned off while an air bearing flow is maintained. The wafer holder 1310 holding the wafer 110 has a scalloped edge 1305. Auxiliary gas lines 1320 and 1330 are optionally used to accelerate and decelerate the wafer holder by impinging a gas flow on to the scalloped edge. The wafer holder may accelerate to the desired velocity and stop within 3 seconds when the auxiliary lines 1320 and 1330 are used. The wafer holder 1310 is constrained to rotate about its axis by a quartz shaft 1350 and quartz or sapphire ball bearing 1360 arrangement (shown later).

FIG. 14 shows an expanded view of the air bearing X of FIG. 13a.

FIG. 15 shows an elevation view of region Y of FIG. 13b of the shaft 1350 attached to the wafer holder 1310 rotating inside quartz bearings 1360 rotating inside a race 1510 fixed with respect to the base.

FIG. 16 is an expanded view of the air bearing shown in FIG. 13a and FIG. 14, with the slot 1610 for the gas flow exit outlined.

FIG. 17 shows a cross section of the air bearing and gas jet assembly of FIG. 16 taken along the line A–A' of FIG. 16.

FIG. 18a and FIG. 18b show elevation and plan views of an alternative bearing for centering the rotating wafer holder. A shaft 1350 attached to the rotatable wafer holder 410 is surrounded by a closely fitting sleeve 1810. The gas pressure of the gas 1820 flowing into the enclosure between the shaft 1350 and the sleeve 1810 ensures that the shaft 1350 rotates freely in the sleeve 1810. The gas 1820 flowing out between the top of the sleeve 1810 and the wafer holder 410 may optionally support the wafer holder.

FIGS. 19a and 19b show an alternative embodiment where air bearings 1910 both support the wafer holder and ensure that the rotating wafer holder rotates about its axis. FIG. 19b shows an elevation of the air bearing 1910 showing an air flow channel 1920 from which two air flow channels 1930 and 1940 separate to two separate gas bearing surfaces 1950 and 1960. The bearing surface 1950 supports the wafer holder, while the bearing surface 1960 bears against the edge of the wafer holder to center the wafer holder. A sliding nozzle 1970 is shown to allow for the expansion of the wafer holder. A semiconductor wafer may increase in diameter by millimeters when treated in an RTP system. A spring (not shown) may optionally be used to withdraw the sliding nozzle 1970 away from the wafer holder 410 when no gas is flowing to rotate the wafer holder.

The above identified U.S. patents and patent applications, and the references cited above, are hereby include herein by reference.

We claim:

1. An apparatus for rapid thermal processing (RTP) of a semiconductor wafer in an RTP system, comprising:
    a base, the base having at least one gas flow channel for impinging a first gas flow on a rotatable wafer holder in the RTP system, the first gas flow acting primarily to support the wafer holder; and
    a means for impinging a second gas flow on the wafer holder, the second gas flow separate from the first gas flow, the second gas flow acting primarily to rotate the wafer holder with respect to the base, the wafer holder for supporting the semiconductor wafer to be processed.

2. The apparatus of claim 1, wherein the semiconductor wafer is a silicon wafer.

3. The apparatus of claim 1, wherein the wafer holder is substantially constrained to rotate about an axis by a pressure distribution of flowing gas.

4. The apparatus of claim 1, wherein the base allows entry of a support pan supporting the semiconductor wafer, the base allows deposition of the semiconductor wafer on the wafer holder, and the base allows withdrawal of the support pan leaving the semiconductor wafer supported by the wafer holder.

5. The apparatus of claim 1, wherein the wafer holder is constrained to rotate about an axis by a pin and detent means.

6. The apparatus of claim 1, wherein the wafer holder is constrained to rotate about an axis by a retainer member fixed with respect to the base.

7. The apparatus of claim 1, wherein the wafer holder is constrained to rotate about an axis by a shaft and bearing means.

8. The apparatus of claim 7, wherein the bearing means is a gas pressure bearing.

9. The apparatus of claim 1, wherein the wafer holder is substantially transparent to radiation from radiation sources of the RTP system.

10. A method for rapid thermal processing (RTP), comprising:
    supporting a semiconductor wafer on a wafer holder in an RTP system; and
    impinging a first gas flow on the wafer holder, the first gas flow acting primarily to support the wafer holder; and
    impinging a second gas flow on the wafer holder, the second gas flow separate from the first gas flow, the second gas flow acting primarily to induce rotation of the wafer holder with respect to the RTP system.

11. The method of claim 10, wherein the semiconductor wafer is a silicon wafer.

12. The method of claim 10, further comprising a step of impinging a gas flow on the wafer holder to stop the rotation of the wafer holder after the step of impinging as gas flow to induce rotation.

13. The method of claim 10, wherein the wafer holder is constrained to rotate about an axis by a pressure distribution of flowing gas.

14. The method of claim 10, wherein a base is fixed with respect to the RTP system, the base having gas flow channels for directing gas flows to support and rotate the wafer holder.

15. The method of claim 14, wherein the base allows entry of a support pan supporting the semiconductor wafer, the base allows deposition of the semiconductor wafer on the wafer holder, and the base allows withdrawal of the support pan leaving the semiconductor wafer supported by the wafer holder.

16. The method of claim 10, wherein the wafer holder is constrained to rotate about an axis by a pin and detent system.

17. The method of claim 10, wherein the wafer holder is constrained to rotate about an axis by fixed retainer members.

18. The method of claim 10, wherein the wafer holder is constrained to rotate about an axis by shaft and bearing means.

19. The method of claim 18, wherein the bearing means is a gas bearing.

20. A system for rapid thermal processing (RTP) of a semiconductor wafer, comprising:
    a radiation source for irradiating the semiconductor wafer;
    an RTP chamber having at least a portion of at least one chamber wall transparent to the radiation from the radiation source;

a base, the base having at least one gas flow channel for impinging a first gas flow on a rotatable wafer holder in the RTP chamber, the first gas flow acting primarily to support the wafer holder;

a means for impinging a second gas flow acting primarily to rotate the wafer holder with respect to the base, the second gas flow separate from the first gas flow; gas supply means for supplying gas for the first and second gas flows and for the RTP chamber; control means for controlling the radiation source and the gas supply means.

21. An apparatus for rapid thermal processing (RTP) of a semiconductor wafer in an RTP system, comprising:

a base, the base having at least one gas flow channel for impinging a first gas flow on a rotatable wafer holder in the RTP system, the first gas flow acting primarily to support the wafer holder;

a second gas flow on a rotatable wafer holder in the RTP system, the second gas flow separate from the first gas flow, the second gas flow acting primarily to rotate the wafer holder with respect to the base, the wafer holder for supporting the object to be processed, wherein the base is transparent to radiation from radiation sources of the RTP system.

22. The apparatus of claim 21, further comprising a means for impinging a third gas flow on to the wafer holder, the third gas flow separate from the second gas flow, the third gas flow for stopping the rotation of the wafer holder induced by the second gas flow.

23. The apparatus of claim 21, further comprising a rotatable wafer holder, where the rotatable wafer holder is transparent to radiation from radiation sources of the RTP system.

24. The apparatus of claim 22, further comprising a rotatable wafer holder, where the rotatable wafer holder is transparent to radiation from radiation sources of the RTP system.

25. The apparatus of claim 1, further comprising a means for impinging a third gas flow on to the wafer holder, the third gas flow separate from the first and from the second gas flows, the third gas flow for stopping the rotation of the wafer holder induced by the second gas flow.

26. The system of claim 20, further comprising a means for impinging a third gas flow on to the wafer holder, the third gas flow separate from the first and from the second gas flows, the third gas flow for stopping the rotation of the wafer holder induced by the second gas flow, wherein the gas supply means also supplies gas for the third gas flow.

* * * * *